United States Patent
Zhang et al.

(10) Patent No.: US 9,715,294 B2
(45) Date of Patent: Jul. 25, 2017

(54) IN-CELL TOUCH PANEL AND MANUFACTURING METHOD THEREOF, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Wenhao Zhang, Beijing (CN); Hui Wang, Beijing (CN); Hengzhen Liang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 27 days.

(21) Appl. No.: 14/369,280

(22) PCT Filed: Dec. 6, 2013

(86) PCT No.: PCT/CN2013/088761
§ 371 (c)(1),
(2) Date: Jun. 27, 2014

(87) PCT Pub. No.: WO2015/027608
PCT Pub. Date: Mar. 5, 2015

(65) Prior Publication Data
US 2015/0261367 A1    Sep. 17, 2015

(30) Foreign Application Priority Data

Aug. 28, 2013 (CN) .......................... 2013 1 0382240

(51) Int. Cl.
*G06F 3/0488* (2013.01)
*G06F 3/041* (2006.01)
(Continued)

(52) U.S. Cl.
CPC ........ *G06F 3/0412* (2013.01); *G02F 1/13338* (2013.01); *G02F 1/136286* (2013.01);
(Continued)

(58) Field of Classification Search
CPC ...... G06F 3/044; G06F 3/0412; G06F 3/0416; G06F 2203/04103
(Continued)

(56) References Cited

U.S. PATENT DOCUMENTS

2009/0309843 A1* 12/2009 Kim .................. G06F 3/0414
345/173
2010/0001939 A1* 1/2010 Ochiai ............. G02F 1/133512
345/88
(Continued)

FOREIGN PATENT DOCUMENTS

CN    102236447 A    11/2001
CN    101807129 A    8/2010
(Continued)

OTHER PUBLICATIONS

Search Report issued in International Application No. PCT/CN2013/088761, fourteen (14) pages.
(Continued)

*Primary Examiner* — Kent Chang
*Assistant Examiner* — Sujit Shah
(74) *Attorney, Agent, or Firm* — Nath, Goldberg & Meyer; Joshua B. Goldberg; Christopher Thomas (57) ABSTRACT

The present invention discloses an in-cell touch panel, a manufacturing method thereof and a display device. A plurality of nanowire arrays are added between an array
(Continued)

substrate and an opposite substrate, nanowires in each nanowire array extend in a direction perpendicular to the array substrate and the opposite substrate; the newly-added nanowire arrays and s pacers provided between the array substrate and the opposite substrate form piezoelectric sensitive elements. Thus, when cell thickness between the array substrate and the opposite substrate is slightly changed due to pressure on the touch panel by any object, a nanowire array may be slightly deformed by squeeze of a spacer, the deformed nanowire array may release charges to change an electrical signal applied to an electrode wire connected thereto, and a touch point can be positioned by detecting a change in the electrical signal, thus achieving high touch sensitivity.

19 Claims, 5 Drawing Sheets

(51) Int. Cl.
*G02F 1/1333* (2006.01)
*G02F 1/1362* (2006.01)
*H01L 27/12* (2006.01)

(52) U.S. Cl.
CPC .......... *G06F 3/0414* (2013.01); *H01L 27/124* (2013.01); *G06F 2203/04103* (2013.01)

(58) Field of Classification Search
USPC .................................................. 345/173–174
See application file for complete search history.

(56) References Cited

U.S. PATENT DOCUMENTS

| | | | |
|---|---|---|---|
| 2010/0207902 A1* | 8/2010 | Juan | G06F 3/045 345/173 |
| 2010/0225608 A1* | 9/2010 | Zhou | G02F 1/13338 345/173 |
| 2011/0310035 A1* | 12/2011 | Kim | G06F 3/044 345/173 |
| 2011/0317115 A1* | 12/2011 | Abiru | G02F 1/13338 349/123 |
| 2013/0038551 A1* | 2/2013 | Shirai | G06F 3/0416 345/173 |
| 2013/0300952 A1* | 11/2013 | Yeh | G02F 1/13338 349/12 |

FOREIGN PATENT DOCUMENTS

| | | |
|---|---|---|
| CN | 101825787 A | 9/2010 |
| CN | 102654681 A | 9/2012 |
| CN | 102707470 A | 10/2012 |
| CN | 203397328 U | 1/2014 |

OTHER PUBLICATIONS

Chinese Office Action dated Jun. 3, 2014 issued in corresponding Chinese application No. 201310382240.8.

* cited by examiner

IN-CELL TOUCH PANEL AND MANUFACTURING METHOD THEREOF, AND DISPLAY DEVICE

This is a National Phase Application filed under 35 U.S.C. 371 as a national stage of PCT/CN2013/088761, filed Dec. 6, 2013, and claims priority benefit from Chinese Application No. 201310382240.8, filed Aug. 28, 2013, the content of each of which is hereby incorporated by reference in its entirety.

FIELD OF THE INVENTION

The present invention relates to the field of display technology, and particularly to an in-cell touch panel and a manufacturing method thereof, and a display device.

BACKGROUND OF THE INVENTION

Touch panels, according to their structures, may be classified into add-on mode touch panels, on-cell touch panels and in-cell touch panels. In an in-cell touch panel, a touch electrode of the touch panel is em bedded inside a liquid crystal display (LCD) screen, which may reduce thickness of the whole module and lower in manufacturing cost of the touch panel.

In-cell touch panels, according to touch-sensing manners, may be classified into resistive touch panels, capacitive touch panels, etc. A resistive touch panel has simple structure, low cost and high sensitivity. However, the resistance touch panel is subject to its physical limitations such as relatively low transmittance, a large detecting area with large line number may impose a burden on a processor and its application characteristics make it apt to age, thus influencing its service life. A capacitive touch panel supports multi-touch function, and has higher transmittance, lower overall power consumption, hard contacting surface and long service life. However, the capacitive touch panel cannot sense a touch of any object other than skin-like materials.

Therefore, the technical problem required to be solved by those skilled in the art is how to combine the advantages of resistive touch panels and capacitive touch panels so as to realize a touch panel which is not only able to sense a touch of any object but also of high touch sensitivity.

SUMMARY OF THE INVENTION

In view of the above problems, an object of the present invention is to provide an in-cell touch panel, a manufacturing method thereof and a display device, to realize a touch panel which is not only able to sense a touch of any object but also of high touch sensitivity.

To achieve the above object, the present invention provides an in-cell touch panel, comprising an array substrate, an opposite substrate and a liquid crystal layer provided therebetween, and further comprising:

a plurality of piezoelectric sensitive elements arranged in matrix between the array substrate and the opposite substrate, each piezoelectric sensitive element comprising: a nanowire array and a spacer; wherein each nanowire in the nanowire array extends in a direction perpendicular to the array substrate and the opposite substrate; and electrode wires electrically connected to the nanowire arrays in the piezoelectric sensitive elements, wherein when the nanowire array in the piezoelectric sensitive element is deformed by squeeze of the spacer, the nanowire array releases charges to change an electrical signal applied to the electrode wire.

In the above in-cell touch panel provided by an embodiment of the present invention, a plurality of nanowire arrays are added between the array substrate and the opposite substrate, nanowires in each nanowire array extend in a direction perpendicular to the array substrate and the opposite substrate; the newly-added nanowire arrays and spacers provided between the array substrate and the opposite substrate form piezoelectric sensitive elements. Thus, when cell thickness between the array substrate and the opposite substrate is slightly changed due to pressure applied on the touch panel by any object, a nanowire array may be slightly deformed by squeeze of a spacer, the deformed nanowire array may release charges to change an electrical signal applied to an electrode wire connected thereto, and a touch point can be positioned by detecting a change in the electrical signal, thus achieving high sensitive touch.

Specifically, in the above touch panel provided by the embodiment of the present invention, the nanowire arrays and the electrode wires are provided on a side of the array substrate facing the liquid crystal layer, and the spacers are provided on a side of the opposite substrate facing the liquid crystal layer; or, the nanowire arrays and the electrode wires are provided on a side of the opposite substrate facing the liquid crystal layer, and the spacers are provided on a side of the array substrate facing the liquid crystal layer; and the spacers and the nanowire arrays in the piezoelectric sensitive elements butt against each other.

Preferably, in order to facilitate deformation of a nanowires array by squeeze of a spacer, pointed ends are provided at sides of the spacers where the spacers and the nanowire arrays butt against each other; or, in order to protect the nanowire arrays from external interference, the spacers wrap the nanowire arrays.

Specifically, in the above-described touch panel provided by the embodiment of the present invention, the nanowire arrays, the electrode wires and the spacers are provided on a side of the array substrate facing the liquid crystal layer; or, the nanowire arrays, the electrode wires and the spacers are provided on a side of the opposite substrate facing the liquid crystal layer; and the spacers in the piezoelectric sensitive elements wrap the nanowire arrays.

Further, in the above-described touch panel provided by the embodiment of the present invention, the electrode wires comprises first electrode wires and second electrode wires intersecting with each other, the nanowire arrays in respective piezoelectric sensitive elements are provided at intersection points of the first electrode wires and second electrode wires, and are connected to the first electrode wires and the second electrode wires.

Specifically, the first electrode wires and gate lines in the array substrate extend in the same direction, and the second electrode wires and data lines in the array substrate extend in the same direction.

Further, when the electrode wires are provided at the side of the array substrate facing the liquid crystal layer, two gate lines are provided between adjacent rows of pixel units in the array substrate, and every two adjacent columns of pixel units, as one pixel unit group, share one data line provided between the two adjacent columns of pixel units; the first electrode wires are provided at intervals between the two gate lines provided between the adjacent rows of pixel units; and the second electrode wires are provided at intervals between adjacent pixel unit groups.

Preferably, to simplify manufacturing process and lower production cost, the first electrode wires and the gate lines are provided at the same layer; and/or the second electrode wires and the data, lines are provided at the same layer.

Specifically, orthogonal projection of the electrode wires on the opposite substrate or on the array substrate is covered by a pattern of a black matrix; the black matrix is provided on the opposite substrate or on the array substrate.

An embodiment of the present invention also provides a display device, comprising the above-described touch panel provided by an embodiment of the present invention.

For the above-described touch panel provided by an embodiment of the present invention, the present invention also provides a manufacturing method of an in-cell touch panel, comprising the steps of 11) forming patterns including gate lines and first electrode wires on an array substrate;

12) forming patterns including data lines and second electrode wires on the array substrate subjected to the process of step 11);

13) forming a passivation insulating layer on the array substrate subjected to the process of step 12), and forming vias at intersection points of the first electrode wires and the second electrode wires, of the passivation insulating layer;

14) forming nanowire arrays in the vias formed in step 13), such that each nanowire in the nanowire arrays extends in a direction perpendicular to the array substrate; and 15) forming a pattern including spacers corresponding to the nanowire arrays on an opposite substrate.

For the above-described touch panel provided by another embodiment of the present invention, the present invention also provides a manufacturing method of an in-cell touch panel, comprising the steps of 21) forming patterns including first electrode wires and second electrode wires on an opposite substrate;

22) preparing nanowire arrays at intersection points of the first electrode wires and the second electrode wires subjected to the process of step 21), such that each nanowire in the nanowire arrays extends in a direction perpendicular to the opposite substrate;

23) preparing a pattern including a black matrix on the opposite substrate subjected to the process of step 22), the pattern of the black matrix covering the patterns of the first electrode wires and the second electrode wires; and 24) forming a pattern including spacers corresponding to the nanowire arrays on an array substrate.

DETAILED DESCRIPTION OF THE EMBODIMENTS

Specific implementations of an in-cell touch panel, a manufacturing method thereof and a display device provided by embodiments of the present invention will be described in detail below in conjunction with the accompanying drawings.

Shapes and thicknesses of respective film layers in the accompanying drawings do not reflect real scale of an array substrate or an opposite substrate, and are only for exemplarily illustrating the present invention.

An in-cell touch panel provided by an embodiment of the present invention, as shown in FIGS. 1 to 4, includes: an array substrate 1, an opposite substrate 2 and a liquid crystal layer 3 between the array substrate 1 and the opposite substrate 2, and further includes a plurality of piezoelectric sensitive elements 4 arranged in matrix (dot matrix) between the array substrate 1 and the opposite substrate 2, each piezoelectric sensitive element 4 comprising a nanowire array 5 and a spacer 6; wherein each nanowire in the nanowire array 5 extends in a direction perpendicular to the array substrate 1 and the opposite substrate 2; the nanowire array 5 and the spacer 6 are configured so that the nanowire array 5 may be deformed by squeeze of the spacer 6 when the touch panel is subject to a pressure; and electrode wires 7 electrically connected to the nanowire arrays 5 in the piezoelectric sensitive elements 4, when a nanowire array 5 in a piezoelectric sensitive element 4 is deformed by the squeeze of a spacer 6, the nanowire array 5 releasing charges to change an electrical signal applied to a electrode wire 7.

In specific implementation, the nanowire arrays 5 may be prepared by using traditional process, such as, by performing template electro-deposition, or adopting coordination chemistry method, or the like using aluminum oxide; also, the nanowire arrays 5 may be prepared by using the latest three dimensional printing technology supplemented with annealing process. In addition, the nanowire arrays 5 may also be prepared by using zinc oxide or other materials with similar properties, which is not limited herein.

In the above-described in-cell touch panel provided by the embodiment of the present invention, a plurality of nanowire arrays 5 are added between the array substrate 1 and the opposite substrate 2, and nanowires in each nanowire array 5 extend in a direction perpendicular to the array substrate 1 and the opposite substrate 2; the newly-added nanowire arrays 5 and the spacers 6 between the array substrate 1 and the opposite substrate 2 form the piezoelectric sensitive elements 4. Thus, when cell thickness between the array substrate 1 and the opposite substrate 2, that is, the distance between the array substrate 1 and the opposite substrate 2, is slightly changed due to pressure applied on the touch panel by any object, a nanowire array 5 is slightly deformed by the squeeze of a spacer 6, the deformed nanowire array 5 may release charges to change an electrical signal applied to an electrode wire 7 connected thereto, and a touch point may be positioned by detecting a change in the electrical signal, thus achieving high touch sensitivity.

Figure 1:
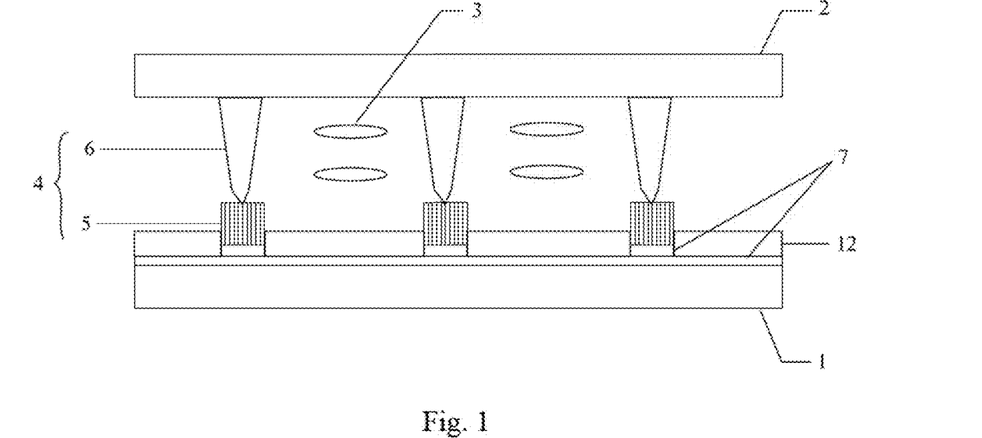
FIG. 1 is a schematic diagram of a first structure of an in-cell touch panel provided by an embodiment of the present invention.
Figure 2:
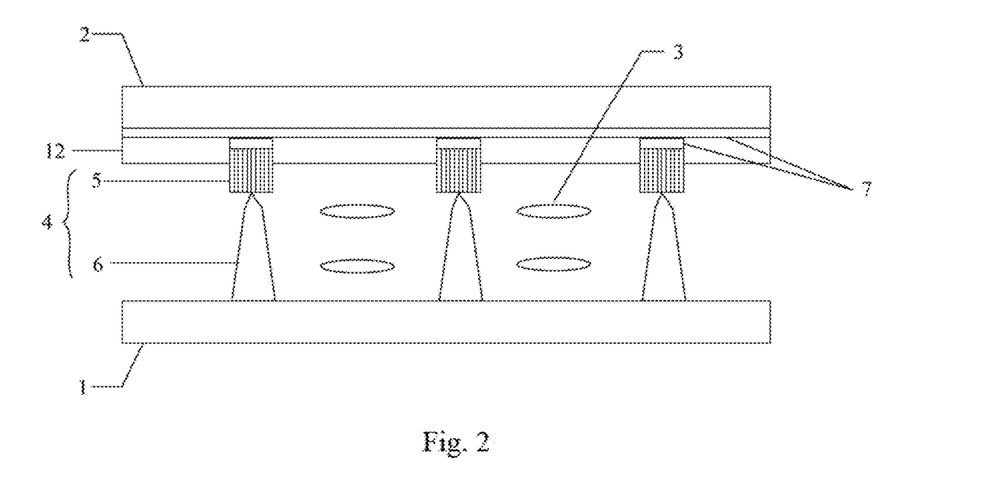
FIG. 2 is a schematic diagram of a second structure of an in-cell touch panel provided by an embodiment of the present invention.

For the above-described touch panel provided by the embodiment of the present invention, in its specific implementation, the spacer 6 and the nanowire array 5 in each piezoelectric sensitive element 4 may be configured to butt against each other, and the sum of the heights of the spacer 6 and the nanowire array 5 is equal to the cell thickness between the array substrate 1 and the opposite substrate 2, as illustrated in FIGS. 1 and 2.

Specifically, in the specific implementation, the nanowire arrays 5 and the electrode wires 7 may be provided at a side of the array substrate 1 facing the liquid crystal layer 3, while the spacers 6 are provided at a side of the opposite substrate 2 facing the liquid crystal layer 3, as illustrated in FIG. 1; alternatively, the nanowire arrays 5 and the electrode wires 7 may be provided at a side of the opposite substrate 2 facing the liquid crystal layer 3, while the spacers 6 are provided at a side of the array substrate 1 facing the liquid crystal layer 3, as shown in FIG. 2.

Preferably, to further improve touch sensitivity, pointed ends are provided at sides of the spacers 6 where the spacers 6 and the nanowire arrays 5 butt against each other, as shown in FIGS. 1 and 2. When the cell thickness between the array substrate 1 and the opposite substrate 2 are slightly changed due to the pressure applied on the touch panel by any object, a nanowire array 5 may be slightly deformed by the squeeze of a spacer 6. When external force applied to the touch panel by any object is fixed, the smaller the contact area between the spacer 6 and the nanowire array 5 is, the easier it is for the nanowire array 5 to be deformed, then it is easier for the charges released by the nanowire array 5 after being deformed to affect the electrical signal output from the electro de wire 7 electrically connected to the nanowire array 5, and thus it is easier to position the touch point, that is, a higher touch sensitivity is achieved.

Figure 3:
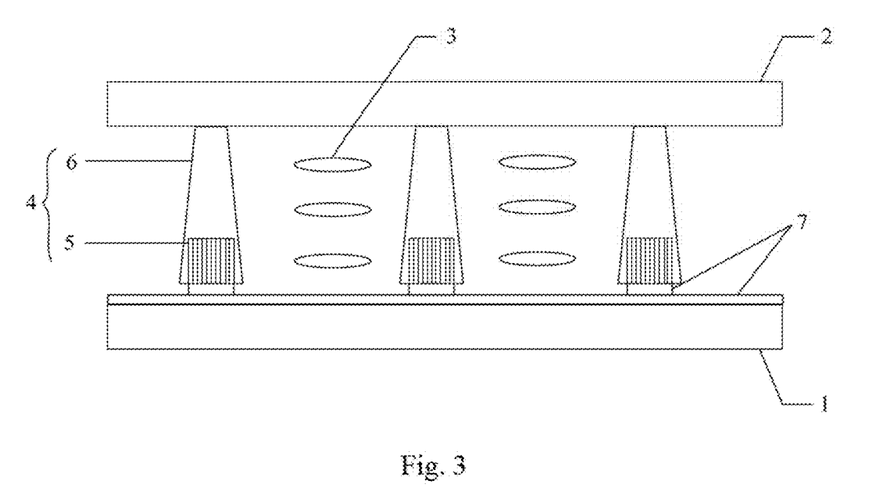
FIG. 3 is a schematic diagram of a third structure of an in-cell touch panel provided by an embodiment of the present invention.
Figure 4:
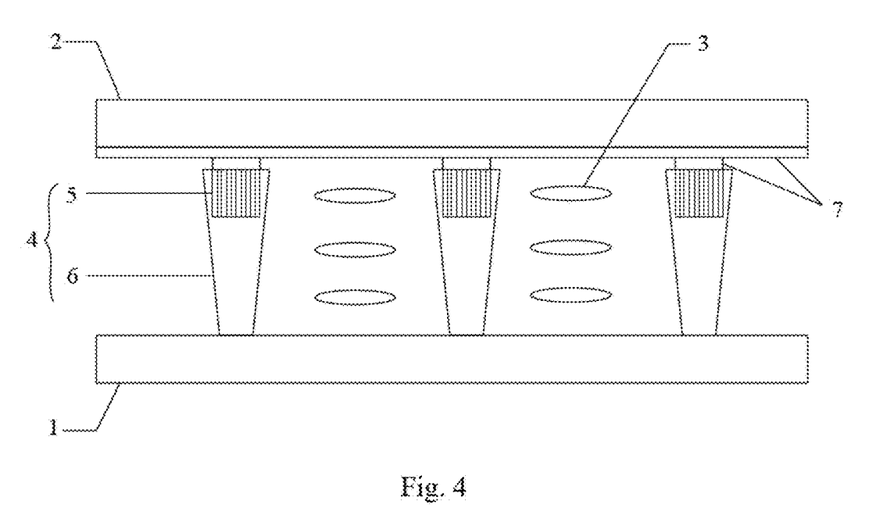
FIG. 4 is a schematic diagram of a fourth structure of an in-cell touch panel provided by an embodiment of the present invention.

For the above-described touch panel provided by the embodiment of the present invention, in its specific implementation, the spacers 6 in respective piezoelectric sensitive elements 4 may also wrap the nanowire arrays 5, as illustrated in FIGS. 3 and 4. As the nanowire arrays 5 are wrapped by the respective spacers 6, they are insusceptible to external interference, which may ensure stability of the nanowire arrays 5 and prolong their service life.

Specifically, in specific implementation, the nanowire arrays 5, the electrode wires 7 and the spacers 6 may be provided at a side of the array substrate 1 facing the liquid crystal layer 3, as shown in FIG. 3; or, the nanowire arrays 5, the electrode wires 7 and the spacers 6 may also be provided at a side of the opposite substrate 2 facing the liquid crystal layer 3; or, the nanowire arrays 5 and the electrode wires 7 are provided at the side of the array substrate 1 facing the liquid crystal layer 3, and the spacers 6 are provided at the side of the opposite substrate 2 facing the liquid crystal layer 3; or, the nanowire arrays 5 and the electrode wires 7 are provided at the side of the opposite substrate 2 facing the liquid crystal layer 3, and the spacers 6 are provided at the side of the array substrate 1 facing the liquid crystal layer 3, as shown in FIG. 4.

Further, in a display device, the spacers 6 are generally provided at intervals between respective pixel units, the intervals between respective pixel units are provided with a black matrix, which is used for shielding gate lines, data lines, common electrode wires, thin film transistors and the like so as to prevent the display device from leaking light, and accordingly, the nanowire arrays 5 forming the piezoelectric sensitive elements 4 together with respective s pacers 6 are provided at the intervals between respective pixel units as well. As a result, the newly-added nanowire arrays 5 are also shielded by the existing black matrix, no extra black matrix needs to be provided to shield respective nanowire arrays 5, and therefore, the newly-added nanowire arrays 5 may not affect aperture rate of the display device.

Preferably, in the above-described touch panel provided by the embodiment of the present invention, as the nanowire arrays 5 may have been deformed due to the pressure from the spacers 6 after the array substrate 1 and the opposite substrate 2 were aligned to form a cell, the effect of this deformation on the electrical signals applied to the electrode wires needs to be eliminated before touch detecting is started, so as to avoid in is-determination caused by the original deformation of the nanowire arrays 5.

Figure 5:
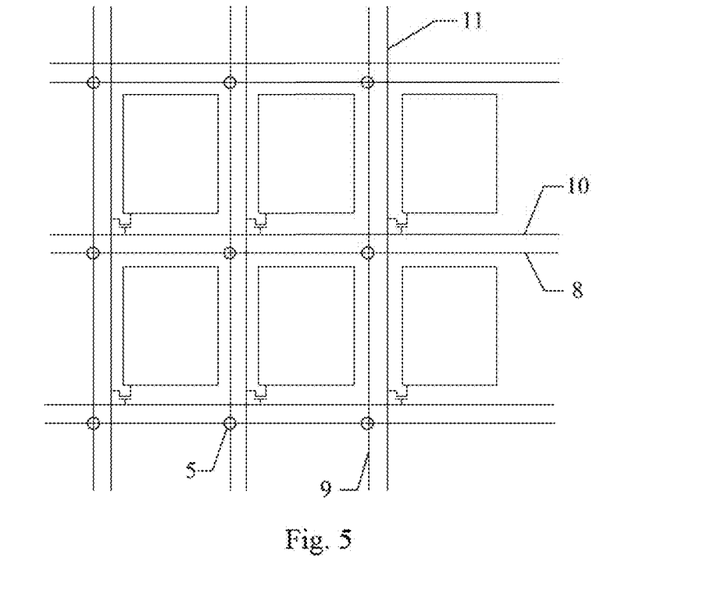
FIG. 5 is a schematic diagram of a structure of an array substrate in Embodiment 1 of the present invention.

Further, in the above-described touch panel provided by the embodiment of the present invention, as shown in FIG. 5, the electrode wires 7 electrically connected to the nanowire arrays 5 in the piezoelectric sensitive elements 4, in specific implementation, may include first electrode wires 8 and second electrode wires 9 intersecting with each other, furthermore, distribution density of the piezoelectric sensitive elements 4 may be adjusted according to touch accuracy, and distribution density of the respective first and second electrode wires 8 and 9 is adjusted according to the distribution density of the piezoelectric sensitive elements 4. Furthermore, the nanowire arrays 5 in respective piezoelectric sensitive elements 4 may be provided at intersection points of the first electrode wires 8 and the second electrode wires 9, and are electrically connected to the first and second electrode wires 8 and 9, respectively; also, the nanowire arrays 5 may be provided at other positions as long as the condition that the nanowire arrays 5 are electrically connected to both the first electrode wires 8 and the second electrode wires 9 is satisfied. Further, the nanowire arrays 5 may be provided at every intersection point, and alternatively, the number of the nanowire arrays 5 may be appropriately reduced according to the touch accuracy, which is not limited herein.

In the above-described touch panels provided by the embodiments of the present invention, positions of the electrode wires 7 are associated with those of the nanowire arrays 5, and the electrode wires 7 and the nanowire arrays 5 are generally provided on the same substrate (the array substrate 1 or the opposite substrate 2). In specific implementation, the electrode wires 7 may be provided at the side of the array substrate 1 facing the liquid crystal layer 3, or at the side of the opposite substrate 2 facing the liquid crystal layer 3, which is not limited herein.

The above two distribution manners of the electrode wires 7 in the above-described touch panel provided by the embodiment of the present invention will be described in details below by way of two specific examples.

Example 1: The Electrode Wires 7 are on the Side of the Array Substrate 1 Facing the Liquid Crystal Layer 3

As shown in FIG. 5, an extending direction of the first electrode wires 8 may be set to be the same as that of the gate lines 10 in the array substrate 1, and an extending direction of the second electrode wires 9 may be set to be the same as that of the data lines 11. Of course, when the electrode wires 7 are provided on the side of the opposite substrate 2 facing the liquid crystal layer 3, the extending directions of the first electrode wires 8 and the second electrode wires 9 may be set in the same manner. During touch detecting, electrical signals are input to one ends of the first and second electrode wires 8 and 9, respectively, and outputs from the other ends of the first and second electrode wires 8 and 9 are detected. When the cell thickness between the arrays substrate 1 and the opposite substrate 2 is slightly changed due to the pressure applied on the touch panel by any object, a nanowire array 5 may be slightly deformed by the squeeze of a spacer 6, and the deformed nanowire array 5 may release charges so that voltage applied to an electrode wire 7 connected thereto is increased. Therefore, position of a touch point can be determined according to whether there is a change in the electrical signals on the first electrode wires 8 and the second electrode wires 9 intersecting with each other.

Figure 6:
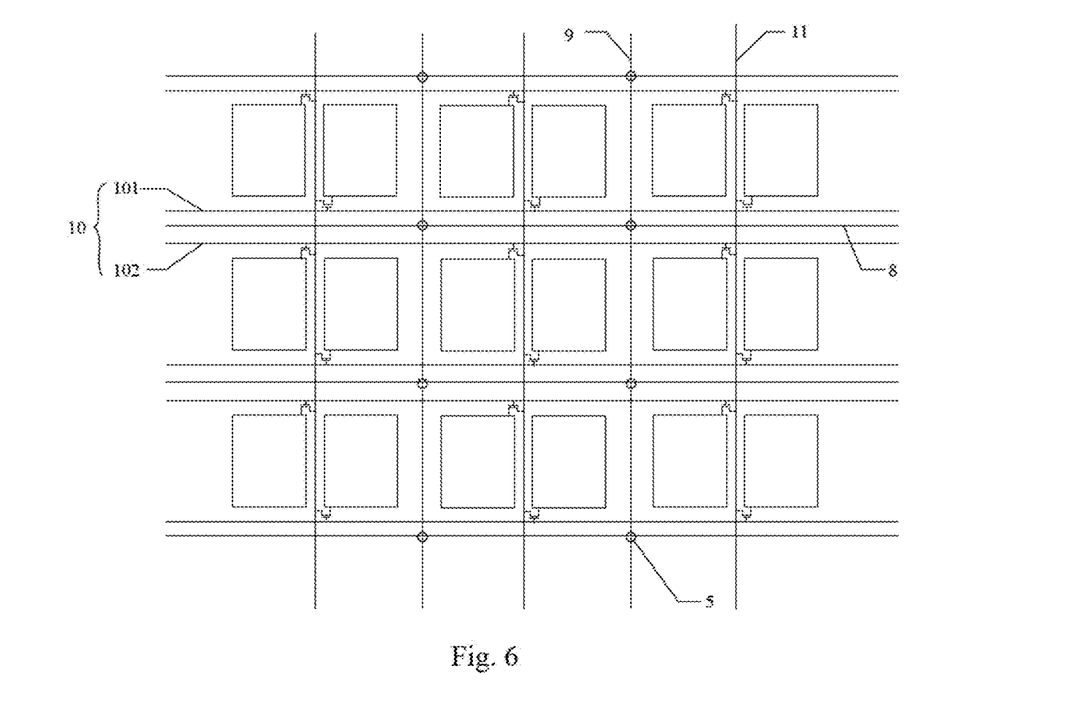
FIG. 6 is a schematic diagram of another structure of an array substrate in Embodiment 1 of the present invention.

Preferably, in the above-described touch panel provided by the embodiment of the present invention, to increase aperture ratio of the touch panel to the largest extent, in specific implementation, pixel structure in the array substrate of the touch panel may be dual gate structure in which two gate lines 101 and 102 are provided between adjacent rows of pixel units on the array substrate, and every two adjacent columns of pixel units is set as a pixel unit group sharing one data line 11 provided between the two adjacent columns of pixel units, as shown in FIG. 6.

The above-described dual gate structure may spare space for some data lines by doubling the gate lines. As such, the first electrode wires 8 may be provided at the intervals between the two gate lines 101 and 102 between the adjacent rows of the pixel units, and the second electrode wires 9 may be provided at the intervals between the adjacent pixel unit groups, that is, the second electrode wires 9 are provided at the intervals between the adjacent pixel units that do not share the same data line, as shown in FIG. 6. The above wiring manner, by using the spared space for some data lines in the dual gate structure to arrange the second electrode wires 9, may not overly occupy the aperture area, can not only ensure the aperture ratio of the touch panel to the greatest extent, but also prevent signals transmitted on the second electrode wires from interfering with signals transmitted on the data lines.

Further, to simplify manufacturing process and lower production cost, the first electrode wires 8 and the gate lines 10 may be provided at the same layer; and/or, the second electrode wires 9 and the data lines 11 may be provided at the same layer.

An embodiment of the present invention also provides a manufacturing method of the above-described in-cell touch panel, which specifically includes the steps of s101. forming patterns including gate lines 10 and first electrode wires 8 on an array substrate 1;

s102. forming patterns including data line s11 and second electrode wires 9 on the array substrate 1 subjected to the process of step s101;

s103. forming a passivation insulating layer 12 on the array substrate 1 subjected to the process of step s102, and forming vias at intersection points of the first electrode wires 8 and the second electrode wires 9, of the passivation insulating layer 12;

s104. forming nanowire arrays 5 in the vias formed in step s103, such that each nanowire in the nanowire arrays 5 extends in a direction perpendicular to the array substrate 1; and s105. forming a pattern including spacers 6 corresponding to the nanowire arrays 5 on an opposite substrate 2.

Example 2: The Electrode Wires 7 are Provided on the Side of the Opposite Substrate 2 Facing the Liquid Crystal Layer 3

In order not to affect aperture ratio and transmittance of the touch panel, no matter whether the electrode wires 7 are provided on the side of the array substrate 1 facing the liquid crystal layer 3 or on the side of the opposite substrate 2 facing the liquid crystal layer 3, the orthographic projection of the electrode wires 7 on any substrate (the array substrate 1 or the opposite substrate 2) should be covered by a pattern of a black matrix, which may be provided on the opposite substrate 2 or on the allay substrate 1. For example, when the black matrix 13 is provided on the opposite substrate 2, the orthographic projection of the electrode wires 7 on the opposite substrate 2 generally should be covered by the pattern of the black matrix 13 provided on the opposite substrate 2, as shown in FIG. 7c. Specifically, when the black matrix 13 is provided on the opposite substrate 2, the electrode wires 7 may be provided between the black matrix 13 and the opposite substrate 2, or may be provided at a side of the black matrix 13 facing the liquid crystal layer 3, which is not limited herein.

In specific implementation, the electrode wires 7 may be prepared by using a transparent conductive oxide such as indium tin oxide (ITO), or be prepared by using non-transparent metal, which is note limited herein.

Figure 7A:
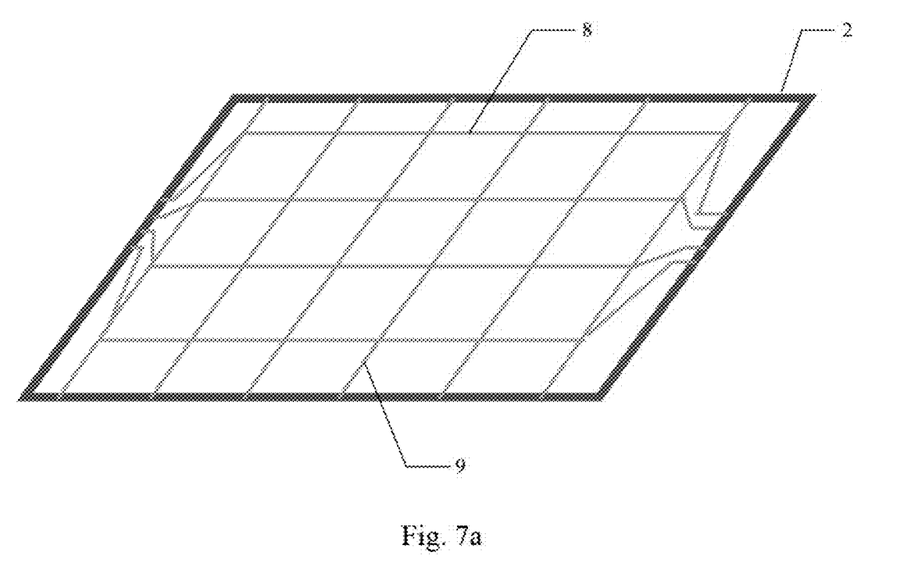
FIGS. 7a to 7c are schematic diagrams of structures of an opposite substrate in each of manufacturing steps according to Embodiment 2 of the present invention, respectively.
Figure 7B:
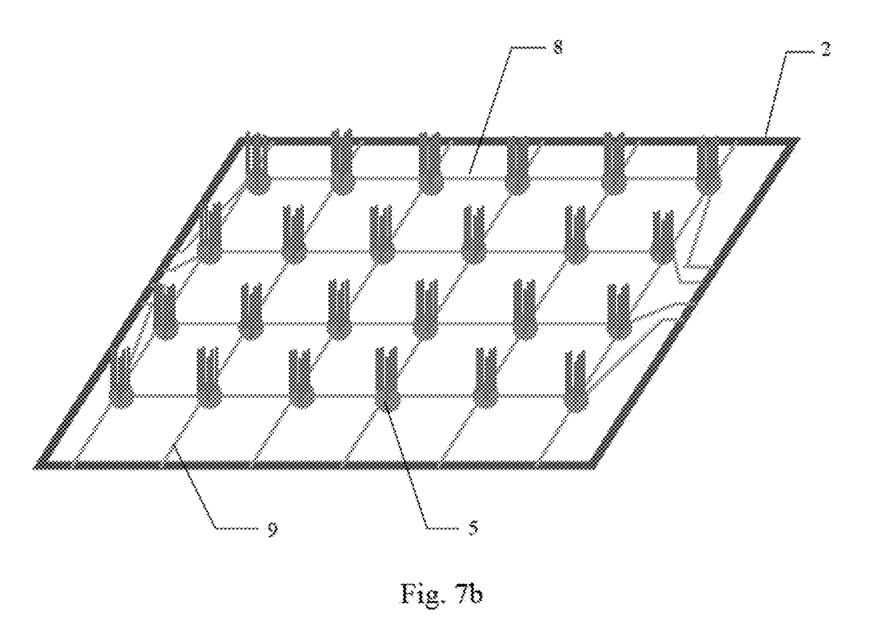
Figure 7C:
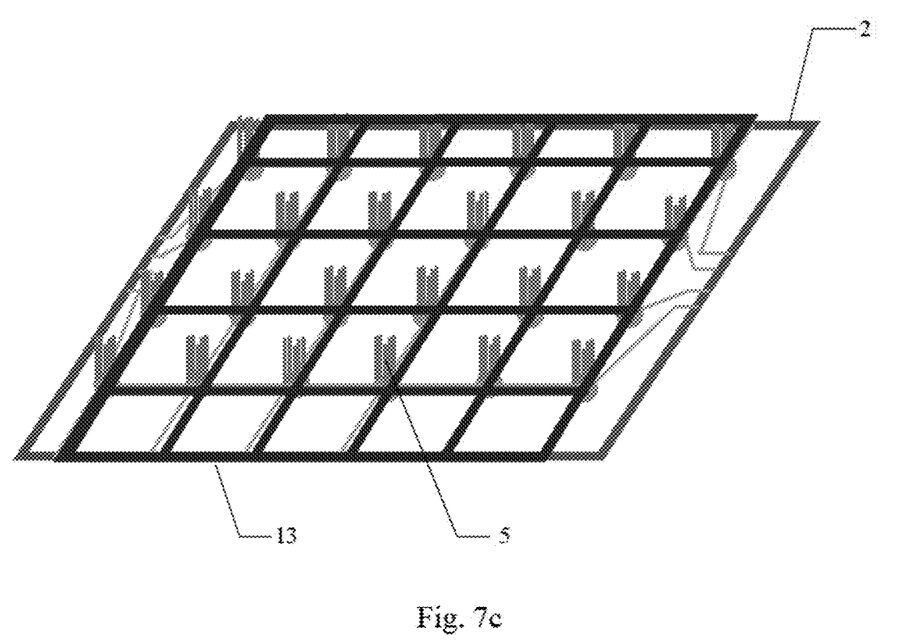

An embodiment of the present invention also provides a manufacturing method of the above-described in-cell touch panel, which specifically includes the steps of:

S201. forming patterns including first electrode wires 8 and second electrode wires 9 on an opposite substrate 2, as shown in FIG. 7a;

S202. preparing nanowire arrays 5 at intersection points of the first electrode wires 8 and the second electrode wires 9 formed in step s201, such that each nanowire in the nanowire arrays 5 extends in a direction perpendicular to the opposite substrate 2, as shown in FIG. 7b;

S203. preparing a pattern including a black matrix 13 on the opposite substrate 2 subjected to the process of step s202, the pattern of the black matrix 13 covering the patterns of the first electrode wires 8 and the second electrode wires 9, as shown in FIG. 7c; and S204. forming a pattern including spacers 6 corresponding to the nanowire arrays 5 on an array substrate 1.

Touch panels resulted from the steps s201 to s204 apply particularly to Advanced-Super Dimensional Switching (ADS) and In-Plane Switching (IPS) liquid crystal display (LCD) screen, as common electrode wires of these two kinds of LCD screens are on the side of the array substrate facing the liquid crystal layer, signal interference with the common electrode wires caused by the electrode wires 7 may be avoided, and meanwhile, the piezoelectric sensitive elements provided on the side of the opposite substrate 2 facing the liquid crystal layer 3 is closer to the touch surface, which may ensure better touch sensitivity of the touch panel.

Based on the same inventive concept, an embodiment of the present invention also provides a display device, comprising the above in-cell touch panel provided by an embodiment of the present invention, and the display device may be any product or component with display function, such as a cell phone, a tablet computer, a television, a display, a notebook computer, a digital frame, or a navigator. The implementation of the display device may refer to the above embodiments of the in-cell touch panel, and repetitive description is omitted.

Obviously, those skilled in the art may make various modifications and variations without departing from the spirit and scope of the present invention. Thus, if these modifications and variations fall in the scope of the claims of the present invention and their equivalents, the present invention intends to cover these modification and variations.

The invention claimed is:

1. An in-cell touch panel, comprising an array substrate, an opposite substrate and a liquid crystal layer provided therebetween, and further comprising:

a plurality of piezoelectric sensitive elements arranged in matrix between the array substrate and the opposite substrate, each piezoelectric sensitive element comprising: a nanowire array and a spacer; wherein the nanowire array is provided on one of the array substrate and the opposite substrate, the spacer is provided on the other of the array substrate and the opposite substrate, and each nanowire in the nanowire array extends in a direction perpendicular to the array substrate and the opposite substrate; and electrode wires electrically connected to the nanowire arrays in the piezoelectric sensitive elements, wherein when the nanowire array in the piezoelectric sensitive element is deformed by squeeze of the spacer, the nanowire array releases charges to change an electrical signal applied to the electrode wire.

2. The touch panel of claim 1, wherein the nanowire arrays and the electrode wires are provided on a side of the array substrate facing the liquid crystal layer, and the spacers are provided on a side of the opposite substrate facing the liquid crystal layer; or, the nanowire arrays and the electrode wires are provided on a side of the opposite substrate facing the liquid crystal layer, and the spacers are provided on a side of the array substrate facing the liquid crystal layer; and the spacers and the nanowire arrays in the piezoelectric sensitive elements butt against each other, wherein in each piezoelectric sensitive element, only a part of the nanowire array away from the substrate on which the nanowire array is provided is in contact with the spacer.

3. The touch panel of claim 2, wherein pointed ends are provided at sides of the spacers where the spacers and the nanowire arrays butt against each other.

4. The touch panel of claim 2, wherein
the spacers in the piezoelectric sensitive elements wrap the nanowire arrays.

5. The touch panel of claim 3, wherein the electrode wires comprises first electrode wires and second electrode wires intersecting with each other, the nanowire arrays in respective piezoelectric sensitive elements are provided at intersection points of the first electrode wires and second electrode wires, and are connected to the first electrode wires and the second electrode wires.

6. The touch panel of claim 5, wherein the first electrode wires and gate lines in the array substrate extend in the same direction, and the second electrode wires and data lines in the array substrate extend in the same direction.

7. The touch panel of claim 6, wherein when the electrode wires are provided at the side of the array substrate facing the liquid crystal layer, two gate lines are provided between adjacent rows of pixel units in the array substrate, and every two adjacent columns of pixel units, as one pixel unit group, share one data line provided between the two adjacent columns of pixel units; the first electrode wires are provided at intervals between the two gate lines provided between the adjacent rows of pixel units; and the second electrode wires are provided at intervals between adjacent pixel unit groups.

8. The touch panel of claim 7, wherein the first electrode wires and the gate lines are provided at the same layer; and/or
the second electrode wires and the data lines are provided at the same layer.

9. The touch panel of claim 5, wherein orthogonal projection of the electrode wires on the opposite substrate or on the array substrate is covered by a pattern of a black matrix; the black matrix is provided on the opposite substrate or on the array substrate.

10. A display device, comprising an in-cell touch panel, wherein the in-cell touch panel comprises an array substrate, an opposite substrate and a liquid crystal layer provided therebetween, and further comprising:

a plurality of piezoelectric sensitive elements arranged in matrix between the array substrate and the opposite substrate, each piezoelectric sensitive element comprising: a nanowire array and a spacer; wherein the nanowire array is provided on one of the array substrate and the opposite substrate, the spacer is provided on the other of the array substrate and the opposite substrate, and each nanowire in the nanowire array extends in a direction perpendicular to the array substrate and the opposite substrate; and electrode wires electrically connected to the nanowire arrays in the piezoelectric sensitive elements, wherein when the nanowire array in the piezoelectric sensitive element is deformed by squeeze of the spacer, the nanowire array releases charges to change an electrical signal applied to the electrode wire.

11. The display device of claim 10, wherein the nanowire arrays and the electrode wires are provided on a side of the array substrate facing the liquid crystal layer, and the spacers are provided on a side of the opposite substrate facing the liquid crystal layer; or, the nanowire arrays and the electrode wires are provided on a side of the opposite substrate facing the liquid crystal layer, and the spacers are provided on a side of the array substrate facing the liquid crystal layer; and the spacers and the nanowire arrays in the piezoelectric sensitive elements butt against each other, wherein in each piezoelectric sensitive element, only a part of the nanowire array away from the substrate on which the nanowire array is provided is in contact with the spacer.

12. The display device of claim 11, wherein pointed ends are provided at sides of the spacers where the spacers and the nanowire arrays butt against each other.

13. The display device of claim 11, wherein the spacers in the piezoelectric sensitive elements wrap the nanowire arrays.

14. The display device of claim 12, wherein the electrode wires comprises first electrode wires and second electrode wires intersecting with each other, the nanowire arrays in respective piezoelectric sensitive elements are provided at intersection points of the first electrode wires and second electrode wires, and are connected to the first electrode wires and the second electrode wires.

15. The display device of claim 14, wherein the first electrode wires and gate lines in the array substrate extend in the same direction, and the second electrode wires and data lines in the array substrate extend in the same direction.

16. The display device of claim 15, wherein when the electrode wires are provided at the side of the array substrate facing the liquid crystal layer, two gate lines are provided between adjacent rows of pixel units in the array substrate, and every two adjacent columns of pixel units, as one pixel unit group, share one data line provided between the two adjacent columns of pixel units; the first electrode wires are provided at intervals between the two gate lines provided between the adjacent rows of pixel units; and the second electrode wires are provided at intervals between adjacent pixel unit groups.

17. The display device of claim 16, wherein the first electrode wires and the gate lines are provided at the same layer; and/or the second electrode wires and the data lines are provided at the same layer.

18. The display device of claim 12, wherein orthogonal projection of the electrode wires on the opposite substrate or on the array substrate is covered by a pattern of a black matrix; the black matrix is provided on the opposite substrate or on the array substrate.

19. A manufacturing method of an in-cell touch panel, comprising the steps of:
1) forming patterns including gate lines and first electrode wires on an array substrate;
2) forming patterns including data lines and second electrode wires on the array substrate subjected to the process of step 1);
3) forming a passivation insulating layer on the array substrate subjected to the process of step 2), and forming vias at intersection points of the first electrode wires and the second electrode wires, of the passivation insulating layer;
4) forming nanowire arrays in the vias formed in step 3), such that each nanowire in the nanowire arrays extends in a direction perpendicular to the array substrate; and
5) forming a pattern including spacers corresponding to the nanowire arrays on an opposite substrate; or
1') forming patterns including first electrode wires and second electrode wires on an opposite substrate;
2') preparing nanowire arrays at intersection points of the first electrode wires and the second electrode wires subjected to the process of step 1'), such that each nanowire in the nanowire arrays extends in a direction perpendicular to the opposite substrate;
3') preparing a pattern including a black matrix on the opposite substrate subjected to the process of step 2'), the pattern of the black matrix covering the patterns of the first electrode wires and the second electrode wires; and
4') forming a pattern including spacers corresponding to the nanowire arrays on an array substrate.

\* \* \* \* \*